Jan. 13, 1970 B. W. HAKKI ET AL 3,490,051

BULK SEMICONDUCTOR DIODE DEVICES

Filed April 19, 1967 2 Sheets-Sheet 1

INVENTORS B. W. HAKKI
H. W. THIM
M. UENOHARA
BY
Roderick B. Anderson
ATTORNEY

Jan. 13, 1970 B. W. HAKKI ET AL 3,490,051

BULK SEMICONDUCTOR DIODE DEVICES

Filed April 19, 1967 2 Sheets-Sheet 2

United States Patent Office 3,490,051

Patented Jan. 13, 1970

3,490,051

BULK SEMICONDUCTOR DIODE DEVICES

Basil W. Hakki, Scotch Plains, Hartwig W. Thim, Summit, and Michiyuki Uenohara, Scotch Plains, N.J., assignors to Bell Telephone Laboratories, Incorporated, Murray Hill, Berkeley Heights, N.J., a corporation of New York Continuation-in-part of application Ser. No. 465,266, June 21, 1965. This application Apr. 19, 1967, Ser. No. 632,102

Int. Cl. H03f 3/10; H03b 7/06

U.S. Cl. 330—5 8 Claims

ABSTRACT OF THE DISCLOSURE

Stable amplification in a bulk semiconductor diode characterized by an appropriate product of sample length and carrier concentration is attained by biasing the diode at a voltage appropriate for giving a field rate of transfer $\gamma$ of carriers from the lower energy band to the upper energy band minimum which conforms to the relationship, $$\frac{\epsilon 4\pi^2 D_1}{q\mu_1 L} \lesssim -nL(1+\gamma) \lesssim 2.2\frac{\epsilon v_{01}}{q\mu_1}$$

where $D_1$ is the diffusion constant, $v_{01}$ is the carrier drift velocity, $\mu_1$ is the mobility, $n$ is the carrier concentration, $\epsilon$ is the dielectric permittivity, and L is the sample length.

CROSS-REFERENCE TO RELATED APPLICATION

This application is a continuation-in-part of application Ser. No. 465,266, filed June 21, 1965 and assigned to Bell Telephone Laboratories, Incorporated.

BACKGROUND OF THE INVENTION

Amplification and the generation of radio-frequency oscillations by negative resistance effects in PN junctions of semiconductor devices such as tunnel diodes, are presently quite common. In the paper "Transferred Electron Amplifiers and Oscillators," by C. Hilsum, Proceedings of the IRE, vol. 50, No. 2, page 185, February 1962, the possibility of attaining amplification and the generation of oscillations in homogeneous or bulk semiconductors, that is, semiconductors without junctions, is discussed. The paper points out that some bulk semiconductor materials, such as gallium antimonide and gallium arsenide, have a conduction band with two minima separated by only a small energy difference, and that hence, at high electric field intensities it should be possible to transfer charge carriers to the upper minimum where they will have a lower mobility; the material will then exhibit a lower conductivity. Hilsum concludes that if the conductivity of a homogeneous semiconductive slab could be made to decrease due to carrier transfer as the bias field is increased, a bulk differential negative resistance might be obtained.

In the paper "Instabilities of Current in III–V Semiconductors," by J. B. Gunn, IBM Journal, April 1964, a bulk semiconductor oscillator is described which operates in accordance with the above-described principle. Since Mr. Gunn's publication, many workers in the art have built bulk semiconductor or "Gunn Effect" oscillators, but attempts to build bulk semiconductor amplifiers have been unsuccessful. These devices have heretofore proven to be unstable in that they break into spontaneous oscillations that show no correlation with the applied radio-frequency signal, or they are only conditionally stable in that they break into oscillations that are related to the input signal only in terms of power. It has been thought that an operative, stable, bulk semiconductor amplifier would have certain advantages that are not attainable in junctiontype negative resistance semiconductor amplifiers notably higher power capabilities, and higher frequencies of operation.

SUMMARY OF THE INVENTION

Accordingly, an object of this invention is a bulk semiconductor device which is suitable for stable coherent amplification of high frequency signal waves.

Another object of this invention is a bulk semiconductor device which is capable of amplification or oscillation at frequencies other than the inherent traveling domain frequency.

These and other objects of the invention are attained in an amplifier circuit containing a bulk semiconductor device of the general type described in the Hilsum paper. In the absence of an applied electric field, the carrier concentration in the lower of two energy bands is much higher than that in the upper energy band at the temperature of operation. The mobility of the current carriers in the lower energy band is greater than that in the upper energy band. Under these conditions, a redistribution of carrier populations between the two energy bands can be induced by appropriate electric fields resulting in a differential negative resistance within the semiconductor medium. In our experiments we used the III–V compound gallium arsenide, although other materials could be used for meeting the requirements that will be stated in more detail later.

In accordance with the invention, a direct-current bias voltage and a high frequency signal voltage are applied between ohmic contacts on opposite sides of the semiconductor wafer. As will be explained more fully later, stable amplification requires a proper choice of the product of carrier concentration and sample length in relation to other parameters. For example, for GaAs, the (carrier concentration)$\times$(sample length) product should be less than $2\times10^{12}$ cm.$^{-2}$. Further, if an N-type semiconductor is used, care must be taken to avoid any substantial field perturbations near the negative electrode, while if P-type material is used, field perturbations should not be formed near the positive electrode. These requirements are attained, in essence, by making the interface of the semiconductor with the contact material planar and as ohmic as is possible.

The amplifying device described can also be used to generate oscillations in an appropriate oscillator circuit. As will be described later, such oscillators are not restricted to the frequency of Gunn-effect oscillators, but can be used for generating higher frequencies.

DRAWING DESCRIPTION

These and other objects and features of the invention will be better understood from a consideration of the following detailed description, taken in conjunction with the accompanying drawing, in which.

DETAILED DESCRIPTION

Figure 1:
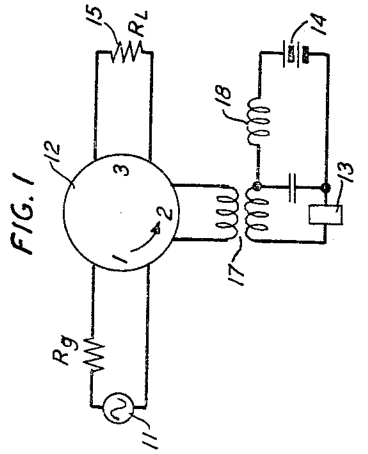
FIG. 1 is a schematic view of an amplifier circuit including a bulk semiconductor amplifier device in accordance with one embodiment of the invention.

Referring now to FIG. 1 there is shown schematically an amplifier circuit comprising a microwave signal source 11, a circulator 12, a bulk semiconductor amplifying device 13, a direct-current voltage source 14, and a load 15 having a load resistance $R_L$. The signal source 11 is connected to the first port of the circulator and is coupled to the semiconductor 13 by way of port 2 of the circulator and a transformer 17. In addition to the signal voltage, a direct-current bias voltage is applied across the semiconductor by the voltage source 14. The transformer 17 blocks direct-current flow to the circulator, while a radio-frequency choke 18 blocks microwave current to the direct-current voltage source 14. As will be explained more fully later, the signal voltage is amplified by the bulk semiconductor device 13. The amplified microwave signal energy is then transmitted to an appropriate load 15 by way of ports 2 and 3 of the circulator.

Figure 2:
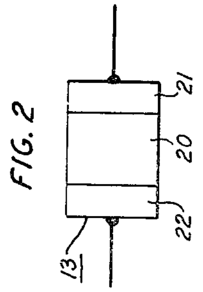
FIG. 2 is a schematic view of a bulk semiconductor amplifier device of the type included in the circuit of FIG. 1.

As shown by the schematic representation of FIG. 2, the semiconductor device 13 comprises a wafer 20 of bulk semiconductor material having on opposite sides ohmic contacts 21 and 22. An appropriate differential negative resistance in the wafer results from a controlled charge carrier transfer, or population redistribution, from a lower enegy band of the medium to a higher energy band. Energy bands here refers to either conduction bands or valence bands depending on the charge of the current carriers. For theoretical discussions that follow, the distance between contacts 21 and 22 will be referred to as the sample length.

The bulk material of slab 20 should display the following characteristics for practical use as an amplifier: the two energy bands are separated by a sufficiently small energy level so that population redistribution can take place at field intensities that are not so high as to be destructive of the material; at zero field intensities the carrier concentration in the lower energy band is at least 10 times that in the upper energy band at the temperature of operation; the mobility of carriers in the lower energy band ($\mu_1$) is more than approximately 5 times greater than the mobility in the upper energy band ($\mu_2$).

In one embodiment of the invention that was built and successfully demonstrated by us, the wafer 20 was n-type monocrystalline gallium arsenide with a carrier concentration in the lower energy level of $10^{13}$–$10^{14}$ per cubic centimeter, a resistivity of 10–100 ohm-centimeters, a $\mu_1$ mobility of about 5000 (centimeters)$^2$ per volt-second and a $\mu_2$ mobility of about 150 (centimeters)$^2$ per volt-second. The wafer had cross-sectional dimensions of 125 by 125 microns with a thickness between ohmic contacts 21 and 22 of 50 microns. A bias field intensity of 3 to 5 kilovolts per centimeter was used for giving stable coherent linear amplification of signals in the 1–12 kmc. range. The manner in which the contacts were formed will be described hereinafter.

Although bulk semiconductor oscillators are known, our amplifier is, to the best of our knowledge, the first successful stable bulk semiconductor amplifier. Furthermore, the microwave amplification that we achieved is a manifestation of a different mode of interaction, within the semiconductor, than has previously been observed. The amplifier operation relies on the controlled excitation of space-charge waves within the semiconductor medium. On the other hand, the Gunn effect, or the traveling domain mode of operation of prior oscillators, is based on the largely uncontrolled formation of high field domains within the bulk material and the movement of these domains from the negative electrode toward the positive electrode. These two distinct modes of interaction can best be distinguished as follows:

(a) Traveling domain mode (Gunn effect)

This mode of operation occurs predominantly when, for gallium arsenide, the product of carrier concentration $n$ and the sample length L exceeds $2\times10^{12}$ cm.$^{-2}$. The main manifestation of this mode is the excitation of largely uncontrolled oscillations. Here, when a direct-current bias of sufficient intensity is applied to the ohmic contacts, a region of slightly higher resistivity is formed at the negative electrode (in an n-type device). A redistribution of the carrier concentrations between the two energy bands occurs which results in the formation of space-charge layers and a region of increased localized electric field intensity referred to in the art as a high electric field domain. Once formed, this domain moves toward the positive electrode. For $nL\gtrsim2\times10^{12}$ cm.$^{-2}$ the formation time of the domain is small compared to its transit time between the electrodes. Hence, for a large part of its lifetime the domain is fully developed and is in thermodynamic equilibrium with its surroundings. Furthermore, since the domain absorbs an appreciable portion of the voltage applied on the sample, the electric field outside of the domain decreases in intensity so that a new domain cannot be formed at the negative electrode. After the traveling domain reaches the positive electrode, the carriers in the upper band fall back to the lower band, the domain is extinguished, and the process is repeated. As a result, the current output is in the form of pulses separated by a period T given by $$T=L/v_d \qquad (1)$$

where L is the wafer thickness between ohmic contacts, and $v_d$ the drift velocity of the traveling domain.

(b) Space-charge wave mode

This mode, which is used in accordance with the invention to give amplification, exists primarily when, for gallium arsenide, the (carrier concentration)$\times$(sample length) product $n$L is less than $2\times10^{12}$ cm.$^{-2}$. Furthermore, the bias voltage on the sample is carefully controlled in such a way that the space-charge wave does not spontaneously transform into a self-regenerating traveling domain. Hence, three operating parameters define this mode of operation: (1) carrier concentration, (2) sample length, (3) bias voltage. Details of this regime will be discussed below.

As opposed to a traveling domain mode, a space-charge wave is a controlled disturbance that conforms to an externally applied signal. Thus, in the space-charge-wave mode the device, when operated at appropriate frequencies, has all the properties inherent in a negative resistance element, including linear amplification. A prerequisite of this linear action is that the growth of the space-charge wave be maintained below its saturation value. The growth rate of the space-charge wave should be sufficient to overcome diffusion, but should be below the rate at which traveling domains form. This imposes restrictions on the operating conditions, which can be represented mathematically by the expression:

$$\frac{\epsilon 4\pi^2 D_1}{q\mu_1 L}\lesssim -nL(1+\gamma)\lesssim 2.2\frac{\epsilon v_{o1}}{q\mu_1} \qquad (2)$$

where $D_1$ is the diffusion constant, $v_{o1}$ is the carrier drift velocity, $\mu_1$ is the mobility, $n$ is the carrier concentration, $\epsilon$ is the dielectric permittivity, L is the sample length, and $\gamma$ is the field rate of transfer of carriers from the main band to the subsidiary minimum. Subscript 1 denotes values of parameters in the main conduction band minimum. The parameter $\gamma$ is given phenomenologically by the expression, $$\gamma=-\frac{k(E/E_o)^k}{1+(E/E_o)^k}\approx\frac{\mu_d}{\mu_1}-1 \qquad (3\text{–a})$$

or conversely $$E=E_o\left(\frac{-\gamma}{k+\gamma}\right)^{1/k} \qquad (3\text{–b})$$

where E is the applied electric bias field in volts/cm., $k$ is a constant which for GaAs is 4.5, $E_o$ is an electric field characteristic of the semiconducting medium which for GaAs is 4230 volts/cm., and $\mu_d$ is the bulk differential mobility. The aforementioned Hilsum paper describes a general method for computing the factor $(\gamma+1)$, which is equal to the slope of the curve (near its maximum) of FIG. 4 of the Hilsum paper. For the particular case of GaAs (2) and (3) become:

$$\frac{2\times10^7}{L}\lesssim-(1+\gamma)nL\lesssim6.5\times10^{10}\text{ cm.}^{-2} \quad (4)$$

and $$E=4000\left(\frac{-\gamma}{4.5+\gamma}\right)^{0.222}\text{ v./cm.} \quad (5)$$

Furthermore, field distortion sets a lower limit on the $n$L product given approximately by, $$(nL)_{\text{min.}}\approx10^{10}\text{ cm.}^{-2} \quad (6)$$

Therefore, from (4) and (5), the voltage regime of operation of bulk GaAs as a linear amplifier is completely defined.

The device, when biased properly for spaced-charge wave operation, remains quiescent until R-F energy is applied. Amplification of excited space-charge waves results from population redistribution between the energy bands as described before, but the amplitude of the waves is always dependent upon the applied signal, and when the signal is terminated the operation of the device stops. The space-charge mode can be characterized as a small signal mode because under operating conditions the characteristics of the material differ only slightly from those under the static quiescent conditions, whereas the traveling domain mode is a large signal mode. Saturation of the traveling wave and resultant nonlinear amplification can be avoided by insuring that the output power of the amplifier is at least 20 decibels below the D-C power dissipated by the bias field.

Figure 3:
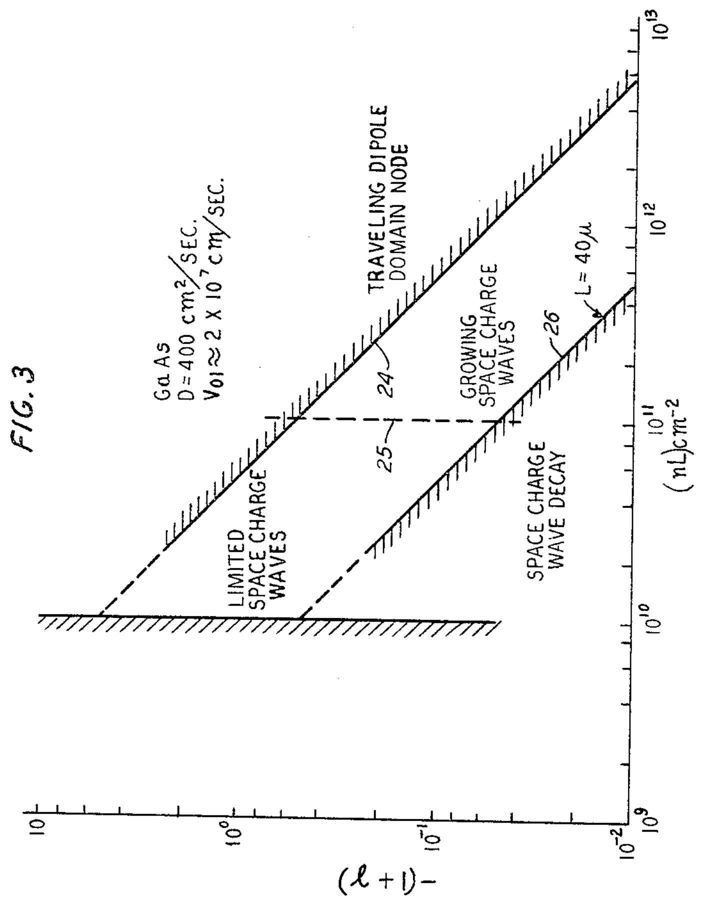
FIG. 3 is a graph of the product of carrier concentration and length versus the parameter $-(1+\gamma)$ of a typical wafer of gallium arsenide that may be used in the device of FIG. 2.

FIG. 3 is a graph of $n$L versus the $-(1+\gamma)$ parameter of Equation 4 for a gallium arsenide sample having a diffusion constant of 400 cm.$^2$/sec. and a drift velocity of $2\times10^7$ cm./sec. which shows the regime of operation defined by Equation 4 as the area bounded by lines 24, 25 and 26 and labelled "Growing Space Charge Waves."

If operation is confined to the region specified in FIG. 3 then the space-charge growth is small enough to allow a small-signal analysis to be performed. Such a small-signal analysis yields an expression for the electronic admittance of bulk semiconductor sample, per unit area, given by $$Ye=\left(\frac{j\omega+\omega_{d1}+\gamma\omega_{d1}}{1+s_1L-\exp.(s_1L)}\right)\epsilon s_1 \quad (7\text{-a})$$

where $\omega$ is the signal frequency, $\omega_{d1}$ is the dielectric relaxation frequency, $s_1$ is the propagation constant for traveling waves in the medium, the remaining terms having been defined earlier.

For maximum gain conditions the load impedance should be comparable in magnitude to the electronic resistance for the sample, i.e., $$R_L\gtrsim|ReYe^{-1}| \quad (7\text{-b})$$

where R$eYe$ denotes the real part of the electronic admittance.

Figure 4:
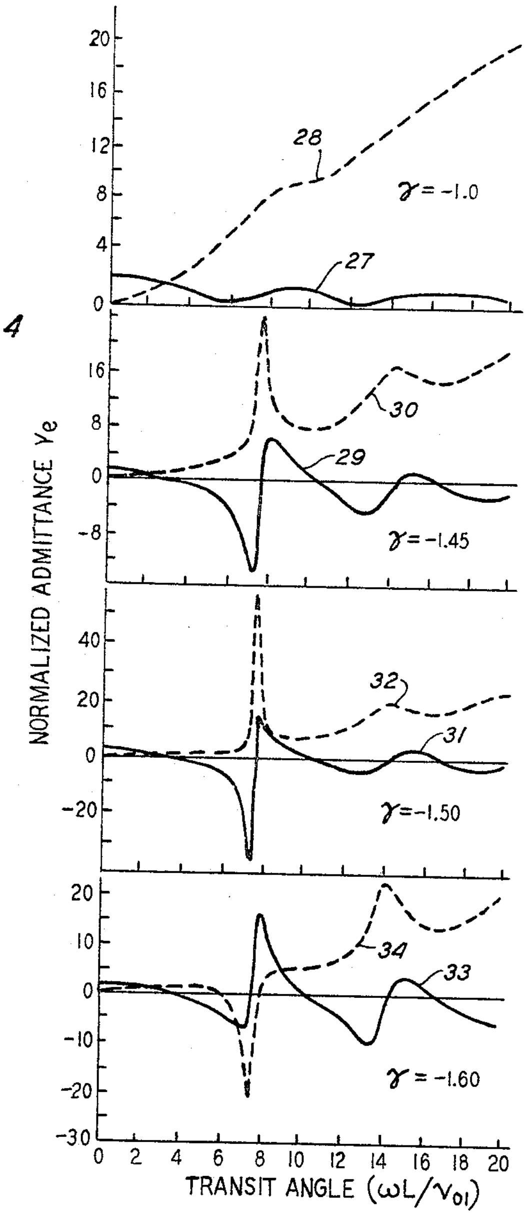
FIG. 4 is a graph of transit angle versus normalized admittance for various values of the parameter $\gamma$ of a semiconductor wafer that may be used in the device of FIG. 2.

As an example, consider a GaAs wafer 40 microns thick and 125 x 125 microns in cross-section. Let the mobile carrier concentration be $3\times10^{13}$ per cubic centimeter, the diffusion constant 400 cm.$^2$/sec., and mobility $\mu_1=5000$ cm.$^2$/v. sec., in the lower conduction band minimum. Furthermore, assume that the mobility and diffusion constant in the upper minimum to be negligibly small. For these operating conditions the resulting electronic admittance of the sample as obtained from (7–a) is shown in FIG. 4. Here, the real and imaginary parts of Y$e$ are plotted as functions of the transit angle $\omega L/v_{01}$; the real parts are shown by the solid curves and the imaginary parts by the dotted curves. Curves 27 and 28 illustrate respectively the real and imaginary parts when $\gamma$ is $-1.0$; curves 29 and 30 are for a $\gamma$ of $-1.45$; curves 31 and 32 are plotted for $\gamma$ equals $-1.50$; and curves 33 and 34 are for $\gamma$ equals $-1.60$.

It is seen that R$eYe$ is negative for $$3<\frac{\omega L}{v_{01}}<7.3 \quad (7\text{-c})$$

These results are in good agreement with the observed experimental behavior of the bulk GaAs amplifier.

Relationship (7–c) and FIG. 4 show that the device displays the negative resistance required for gain at a fundamental frequency range approximately centered about $L/v_{01}$. Solutions of Equation 7–a for long transit time angles show other frequency ranges of negative resistance approximately centered about $NL/v_{01}$, where N is an integer, which are illustrated on FIG. 4 by the repeated dips of curves 29, 31 and 33 below the zero axis. The device will therefore amplify signals within these frequency ranges as described before.

It will be noted that for this particular example, $nL=1.2\times10^{11}$. Hence, from FIG. 3 the largest absolute value of $\gamma$ that can be used is 1.6. For $\gamma<-1.6$ the space-charge wave would transform into a traveling domain, and the device might well break into uncontrolled oscillations. Similarly, from FIG. 3 the minimum value of $|\gamma|$ is approximately 1.1. Hence, for this particular case, the range of values of $\gamma$ for linear amplification is $$-1.6<\gamma<-1.1 \quad (8\text{-a})$$

or from (5) the corresponding range of values of electric bias is:

$$3100<E<4000\text{ v./cm.} \quad (8\text{-b})$$

The foregoing specification of the regime of linear amplification is based on the theoretical considerations discussed in the next section.

Figure 5:
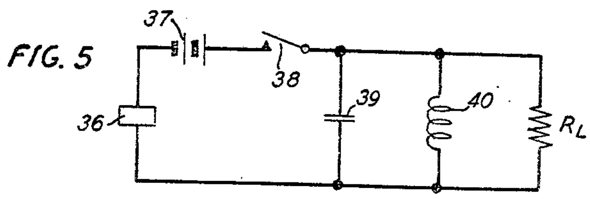
FIG. 5 is a schematic view of an oscillator circuit including a bulk semiconductor device, in accordance with another embodiment of the invention.

From the foregoing it is clear that a bulk device can be made to oscillate in the space-charge mode at frequencies within the negative resistance frequency ranges. Referring to FIG. 5 there is shown schematically an oscilator circuit comprising a bulk semiconductor device 36 having the structure shown in FIG. 2 and the characteristics described above, a D-C voltage source 37, a switch 38, and a resonant circuit comprising a capacitance 39 and an inductance 40. The resonant circuit is tuned to be resonant at a frequency appropriate for negative resistance in accordance with Equation 7–a and the $n$L product of the device and the bias voltage are selected to conform to Equation 2.

When switch 38 is closed, transients at the circuit frequency are amplified by the device, and fed back to the device to establish oscillation in the circuit. Oscillation may also be started from background noise or various other sources of electrical disturbance as known in the art. This oscillator may be preferred over known Gunn-effect oscillators because a wider selection of frequencies of operation are available as indicated by Equation 7–a and FIG. 4. Also, longer wafers can be used for high frequency generation than can be used for Gunn-effect generation of the same frequencies.

(c) Theoretical development

Consider a semiconductor wherein the carriers can be in either of two states, 1 or 2, of distinctly different mobilities, effective masses, and relaxation times. For convective flow, three basic equations are relevant: the current equation, Poisson's equation, and the esuation of conservation of charge. These are written, respectively $$\bar{J}_{1,2}=q\mu_{1,2}n_{1,2}\bar{E}-q\nabla(n_{1,2}D_{1,2} \quad (9)$$

$$\nabla\cdot\bar{E}=q/\epsilon(n_1+n_2-n_d) \quad (10)$$

$$\frac{\partial n_{1,2}}{\partial t}=-\frac{1}{q}\nabla\cdot\bar{J}_{1,2}+\left.\frac{\partial n_{1,2}}{\partial t}\right|_E \quad (11)$$

where $n_d$ is the donor concentration and the rest of the terms have their usual definitions, subscripts 1 and 2 denote the main and the secondary states respectively, and finally $(\partial n_{1,2}/\partial t)|_E$ takes into account the time rate of change of carriers from 1 to 2 as brought about by field induced transitions.

It is assumed in (11) that transitions between states 1 and 2 take place in sufficiently short lengths of time that they may be considered to be instantaneous. Furthermore, since the total charge is conserved between 1 and 2 it is obvious that $$\left.\frac{\partial n_1}{\partial t}\right|_E = \left.\frac{\partial n_2}{\partial t}\right|_E$$

In addition, the field rate of transfer of carriers will be represented as follows:

$$\left.\frac{\partial n_1}{\partial t}\right|_E = \frac{n_1}{E}\gamma\frac{\partial E}{\partial t} \qquad (12\text{–a})$$

where $$\gamma = \frac{E}{n_1}\frac{\partial n_1}{\partial E} \qquad (12\text{–b})$$

Next, the quantities $n$, E, and J will be assumed to consist of a steady state value, denoted by subscript $o$, and a small RF perturbation term, denoted by a prime, as follows:

$$f(z,t) = f_o + f^1(z)e^{j\omega t} \qquad (13)$$

It is seen from (13) that the RF perturbation has been ascribed a hormonic time dependence. However, the spatial variation with respect to distance $z$ is left as an unknown to be solved. Furthermore, the system will be assumed to be unidimensional, i.e., varying with respect to only one coordinate, namely $z$.

In order to further simplify the problem, it will be assumed that $\mu_2 << \mu_1$, $D_2 << D_1$, and hence, conduction in the subsidiary band is negligible. It will further be assumed that the steady state spatial functions are nearly constant independent of coordinate $z$. If thermoelectric currents are neglected in Equations 9 through 11, then the equations describing the RF perturbations reduce to the following set of equations:

$$-D_1\frac{d^2n_1'}{dz^2} + v_{o1}\frac{dn_1'}{dz} + (j\omega + \omega_{d1})n_1' = -\omega_{d1}n_2' + j\omega\frac{n_{10}}{E}\gamma E' \qquad (14\text{–a})$$

$$n_2' \approx -\frac{n_{10}}{E}\gamma E' \qquad (14\text{–b})$$

$$\frac{dE'}{dz} = \frac{q}{\epsilon}(n_1' + n_2') \qquad (14\text{–c})$$

The above equations are to be solved with a certain set of boundary conditions. Ordinarily in this device, the contacts are assumed to be ohmic, with the field intensity approaching zero at the contact surface. Hence, $$E^1(0,t) = 0 \qquad (15\text{–a})$$

$$J^1(0,t) = J_{oD} \qquad (15\text{–b})$$

Where E′(0) is the RF field intensity at the negative electrode and $J_{oD}$ is the diffusion current at the contact.

Now, it is possible to solve (14) and (15). To do this, the Laplace transform is taken of each of the functions, where:

$$Lf(z) \equiv \int_o^\infty f(z)e^{-sz}dz \qquad (16)$$

The resulting set of transformed equations is:

$$[-D_1s^2 + v_{o1}s + (j\omega + \omega_{d1})]N_1'(s) = \gamma\frac{n_{10}}{E}(j\omega + \omega_{d1})E'(s) + \frac{1}{q}J_{oD} \qquad (17\text{–a})$$

$$sE(s) + \gamma\frac{\omega_{d1}}{v_{o1}}E'(s) = \frac{q}{\epsilon}N_1'(s) \qquad (17\text{–b})$$

Now, (17–a) and (17–b) are two simultaneous equations from which the transformed carrier concentration and electric field intensity can be obtained:

$$E'(s) = \frac{J_{oD}}{\epsilon}\,\frac{1}{s\left[-D_1s^2 + \left(v_{o1} - \gamma\frac{\omega_{d1}D_1}{v_{o1}}\right)S + (j\omega + \omega_{d1} + \gamma\omega_{d1})\right]} \qquad (18\text{–a})$$

and $$N_1'(s) = \frac{J_{oD}}{q}\,\frac{1}{s\left[-D_1s^2 + \left(v_{o1} - \gamma\frac{\omega_{d1}D_1}{v_{o1}}\right)s + (j\omega + \omega_{d1} + \gamma\omega_{d1})\right]} \qquad (18\text{–b})$$

From Equations 18–a and 18–b the total current through the semiconductor can be evaluated. The total current is the sum of the convective and displacement currents, i.e., $$J' = qnv + j\omega\epsilon E$$

Hence, the Laplace transform of the total current is $$J'(s) = J_{oD}/s \qquad (19\text{–a})$$

When the inverse Laplace transforms of (19–$a$) is taken an explicit expression for the total current is obtained:

$$J'(z,t) = J_{oD}e^{j\omega t} \qquad (19\text{–b})$$

Next, the inverse Laplace transform of (18–$a$) is taken. This entails finding the residues in the complex $s$-plane. It is obvious from (18–a) that there are three poles. One pole is at $s=0$, and two poles are determined by the roots of the following quadratic equation:

$$as^2 + bs + c = 0 \qquad (20\text{–a})$$

where $$a = -D_1 \qquad (20\text{–b})$$

$$b = v_{o1} - \gamma\frac{\omega_{d1}D_1}{v_{o1}} \qquad (20\text{–c})$$

and $$c = j\omega + \omega_{d1} + \gamma\omega_{d1} \qquad (20\text{–d}$$

The two poles are at:

$$s_1 \approx -\frac{c}{b} - \frac{ac^2}{b^3} \qquad (21\text{–a})$$

and $$s_2 \approx \frac{c}{b} - \frac{b}{a} \qquad (21\text{–b})$$

where it was assumed that the diffusion constant is sufficiently small as to warrant using it as a perturbation term only.

It is seen from (21) that $s_1$, which will be known as the first pole parameter, gives a forward traveling wave, whereas $s_2$, which will be known as the second pole parameter, gives a heavily damped backward wave. Except for proper boundary conditions, $s_2$ will be disregarded. Now, it is possible to take the inverse Laplace transform of (18–a):

$$E'(z,t) = \left\{\frac{J_{oD}/\epsilon}{(j\omega + \omega_{d1} + \gamma\omega_{d1})}(1 - e^{s_1z})\right\}e^{j\omega t} \qquad (22)$$

Since the total RF voltage across the sample is $$V' = \int_o^L E'(z,t)\,dz$$

it follows that $$V'(t) = \frac{J_{oD}}{s_1\epsilon(j\omega + \omega_{d1} + \gamma\omega_{d1})}(1 + s_1L - e^{s_1L})e^{j\omega t} \qquad (23)$$

whereas the electronic sample admittance per unit area is, $$Ye = \frac{J'}{V'} = \frac{\epsilon s_1(j\omega + \omega_{d1} + \gamma\omega_{d1})}{1 + s_1L - e^{s_1L}} \qquad (24\text{–a})$$

Thus, the electronic admittance derived above is the same given earlier in (7) and for which the admittance curve was given in FIG. 4 for a particular case. Of course, negative resistance occurs when the real part of admittance negative resistance occurs when the real part of admittance Y*e* is negative or, $$Re\,\frac{\epsilon s_1(j\omega+\omega_{d1}+\gamma\omega_{d1})}{1+s_1L-e^{s_1L}}<0 \qquad (24\text{–b})$$

(d) Amplifier regime of operation

It was stated earlier that linear amplification entails careful choice of sample length, carrier concentration, and bias voltages. For this FIG. 3 was given to indicate the required choice of parameters. To see how these results were obtained, root $s_1$ given in (21–a) is written in explicit form $$s_1\approx-\left(\frac{j\omega+\omega_{d1}+\gamma\omega_{d1}}{v_{o1}-\gamma\frac{\omega_{d1}D_1}{v_{o1}}}\right)+\frac{D_1(j\omega+\omega_{d1}+\gamma\omega_{d1})^2}{\left(v_{o1}-\gamma\frac{\omega_{d1}D_1}{v_{o1}}\right)^3} \qquad (25\text{–a})$$

which can also be written in the form $$s_1\approx\frac{j\omega}{v_\phi}-\frac{\omega_{d1}(1+\gamma)}{v_{o1}-\gamma\frac{\omega_{d1}D_1}{v_{o1}}}+\frac{D_1[-\omega^2+\omega_{d1}^2(1+\gamma)^2]}{\left(v_{o1}-\gamma\frac{\omega_{d1}D_1}{v_{o1}}\right)^3} \qquad (25\text{–b})$$

where $v_\phi$ is a phase velocity given by:

$$v_\phi=v_{o1}\frac{(1-\gamma\omega_{d1}/\omega_D)^3}{\left\{\left(1-\gamma\frac{\omega_{d1}}{\omega_D}\right)^2-2\frac{\omega_{d1}}{\omega_D}(1+\gamma)\right\}} \qquad (25\text{–c})$$

and $$\omega_D=v_{o1}^2/D_1 \qquad (25\text{–d})$$

Now the real part of (25–b) would determine whether the space-charge wave will grow or decay. Hence, the condition for space-charge growth is $$-\frac{\omega_{d1}(1+\gamma)}{v_{o1}\left(1-\gamma\frac{\omega_{d1}}{\omega_D}\right)}+\frac{[-\omega^2+\omega_{d1}^2(1+\gamma)^2]}{v_{o1}\omega_D\left(1-\gamma\frac{\omega_{d1}}{\omega_D}\right)^3}>0 \qquad (26)$$

For GaAs under typical operating conditions $\omega_D\approx10^{12}$ rad./sec. Similarly for carrier concentration $n<10^{14}$ per cc. it may be assumed that $\omega_{d1}/\omega_D\ll1$. Furthermore, (26) is to be evaluated at those frequencies where the negative electronic conductance is greatest. An inspection of FIG. 4 reveals that this occurs at $\omega=2\pi v_{o1}/L$. Hence, with these assumptions (26) reduces to:

$$\frac{\epsilon 4\pi^2 D_1}{q\mu_1}>-nL^2(1+\gamma) \qquad (27\text{–a})$$

For GaAs with a hot electron diffusion constant of 400 cm.$^2$/sec. the above equation becomes $$2\times10^7<-nL^2(1+\gamma)\ \text{cm.}^{-2}$$

The above equation is plotted as the lower line limit in FIG. 3 for a sample length of 40 microns.

Equation 27–a gives a lower limit on *n*, L, and $\gamma$ below which the space-charge wave would decay. Similarly, there is an upper limit on these parameters beyond which the space-charge wave would experience enough gain as to transform into a traveling domain. Computational analysis of (24) indicates that this upper limit is $$-\frac{\omega_{d1}L}{v_{o1}}(1+\gamma)<2.2 \qquad (28)$$

Hence, from (27–a) and (28) the regime of operation for linear amplification is confined to $$\frac{\epsilon 4\pi^2 D_1}{q\mu_1 L}<-nL(1+\gamma)<\frac{2.2\epsilon v_{o1}}{q\mu_1} \qquad \text{(q.e.d.)}$$

which was given earlier in (2). The foregoing equation gives the region indicated in FIG. 3 as that for linear amplification.

A last factor to be introduced is static field distortion. As the *n*L product is reduced, the bias field has to be raised further in order to achieve gain. But the higher the field, the greater is the field distortion. Hence, a lower absolute limit is imposed on the *n*L product by the maximum field distortion that can be withstood. For gallium arsenide, this lower limit is about $nL\approx10^{10}$ cm.$^{-2}$, and is plotted in FIG. 3 as the lower boundary 25.

Even with a bulk device of the proper parameters including proper length and bias voltage as described above, instability is likely to occur if the contacts 21 and 22 of FIG. 2 do not constitute nearly perfect ohmic contacts. In an n-type device, this is particularly true of the negative electrode, and in a p-type device this is true of the positive electrode. Imperfections at the interface of the negative contact with an n-type slab will result in a slight increase of the localized field intensity which may give rise to a traveling domain even if the bias voltage is below the calculated value for oscillations. Such imperfections can be avoided by making the interface precisely planar, by assuring uniform adherence of the electrode to the semiconductor slab, and by carefully controlling the impurities in the contact material so that a proper match of electrical characteristics is made as required for a good ohmic contact.

The following is a preferred technique which has been successfully used by us, giving good ohmic contacts on n-type gallium arsenide Gunn-effect devices:

First, there is cut from a gallium arsenide crystal of appropriate resistivity a slice about 200 mils square and about 15 mils thick. This slice is then lapped, cleaned and etched to reduce its thickness to the desired value, for example, 50 microns, by standard techniques. Then, there is evaporated in turn over each of the two large area surfaces a layer of indium between 0.2 and 0.4 micron thick. Next, a layer between 0.1 and 0.2 micron thick of nickel is superposed by an electroless nickel plating process over each indium layer. After plating, the slice is rinsed several times in boiling distilled water, once in boiling ethanol, and then dried in a stream of nitrogen gas. The metallic layers are then alloyed to the gallium arsenide by heating to about 450° C. for about 20 seconds. The slice is then diced to provide a number of wafers, each of the desired cross-sectional dimensions, typically 125 microns square. Each wafer then has one plated surface soldered to a copper stud which provides structural support and serves as one lead and the other plated surface pressure contacted to an indium-coated pin which serves as the other lead.

Modifications in this process which proved successful included the substitution of a tin layer of the same thickness for the indium layer and the substitution of an evaporated gold layer in place of the electroless nickel-plated layer.

Although an n-type gallium arsenide amplifying device has been described, it is to be understood that other materials could be used which conform to the conditions and characteristics described above. Various other modifications and embodiments may be made by those skilled in the art without departing from the spirit and scope of the invention.

What is claimed is:

1. In combination:

a microwave negative resistance device comprising a wafer of semiconductor material having two energy bands that are separated by a relatively small energy level, at zero field intensity the carrier concentration in the lower band being at least 10 times that in the upper band, and the mobility of carriers in the lower band being more than approximately 5 times greater than the mobility in the upper energy band;

ohmic contacts spaced apart along the wafer;

means for applying a direct-current bias voltage to the contacts which is sufficiently high to establish a useful population redistribution of charge carriers in the two energy bands, but insufficiently high to excite oscillations in the slab;

the parameters of said wafer when subjected to said bias voltage substantially conforming to the relationship:

$$\frac{\epsilon 4\pi^2 D_1}{q\mu_1 L} \lesssim -nL(1+\gamma) \lesssim 2.2\frac{\epsilon v_{01}}{q\mu_1}$$

where $D_1$ is the diffusion constant of the wafer, $v_{01}$ is the carrier drift velocity of the wafer, $\mu_1$ is the mobility, $n$ is the carrier concentration, $\epsilon$ is the dielectric permittivity, L is the sample length of the wafer, and $\gamma$ is the field rate of transfer of carriers from the lower energy band to the upper band;

and means for applying a microwave voltage between the ohmic contacts for attaining gain.

2. The combination of claim 1 wherein:

the microwave voltage applying means comprises a microwave source delivering energy to be amplified at a frequency within any of a plurality of limited frequency ranges each approximately centered about a frequency equal to $NL/v_{01}$, where N is an interger.

3. The combination of claim 1 wherein:

the microwave voltage applying means comprises a resonant circuit connected to said contacts which is resonant at a frequency within any of a plurality of limited frequency ranges each approximately centered about a frequency equal to $NL/v_{01}$, where N is an integer.

4. The combination of claim 1 wherein:

the wafer is made of gallium arsenide having a (carrier concentration)×(sample length) product of less than $2\times 10^{12}$ cm.$^{-2}$ and the applied bias voltage E substantially conforms to the relation, $$E=4000\left(\frac{-\gamma}{4.5+\gamma}\right)^{.222} \text{ volts per centimeter}$$

5. The combination of claim 1 wherein:

the wafer is made of gallium arsenide having a product of carrier concentration and length approximately equal to $1.2\times 10^{11}$ cm.$^{-2}$ and the applied bias voltage is within the range of 3100 to 4000 volts per centimeter.

6. The combination of claim 1 wherein:

the microwave voltage applying means comprises means for applying a voltage at an angular frequency $\omega$ which substantially conforms to the relation, $$Re\frac{\epsilon s_1(j\omega+\omega_{d1}+\gamma\omega_{d1})}{1+s_1L-e^{s_1L}}<0$$

where $\epsilon$ is the dielectric permittivity, $s_1$ is the first pole parameter, $\omega_{d1}$ is the dielectric relaxation frequency, and L is the wafer length.

7. A method for amplifying microwaves in bulk semiconductor devices of the type comprising the wafer of semiconductor material having two energy bands that are separated by a relatively small energy level, at zero frequency intensity the carrier concentration in the lower band being at least 10 times that in the upper band, and the mobility in the lower band being more than approximately 5 times greater than the mobility in the upper energy band, said method comprising the steps of:

applying between the contacts a direct-current bias of appropriate voltage to establish within the wafer a field rate of transfer $\gamma$ from the lower energy band to the upper band which substantially complies with the relation, $$\frac{\epsilon 4\pi^2 D_1}{q\mu_1 L} \lesssim -nl(1+\gamma) \lesssim 2.2\frac{\epsilon v_{01}}{q\mu_1}$$

where $D_1$ is the diffusion constant of the wafer, $v_{01}$ is the carrier drift velocity of the wafer, $\mu_1$ is the mobility, $n$ is the carrier concentration of the wafer, $\epsilon$ is the dielectric permittivity, and L is the sample length of the wafer;

and applying between the contacts a microwave voltage to be amplified.

8. The combination of claim 7 wherein:

the microwave voltage applying step comprises a step of applying a microwave voltage having a frequency within any of a plurality of limited frequency ranges each approximately centered about a frequency equal to $NL/v_{01}$, where N is an interger.

References Cited

Copeland, "IEEE Transactions on Electron Devices," September 1967, pp. 461–463.

ROY LAKE, Primary Examiner

D. R. HOSTETTER, Assistant Examiner

U.S. Cl. X.R.

330—34; 331—107